(12) United States Patent
Jin

(10) Patent No.: US 9,484,071 B2
(45) Date of Patent: Nov. 1, 2016

(54) VOLTAGE GENERATION CIRCUIT, SEMICONDUCTOR MEMORY APPARATUS HAVING THE SAME, AND OPERATING METHOD THEREOF

(71) Applicant: SK hynix Inc., Icheon-si, Gyeonggi-do (KR)

(72) Inventor: Hyun Jong Jin, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/727,053

(22) Filed: Jun. 1, 2015

(65) Prior Publication Data
US 2016/0275997 A1 Sep. 22, 2016

(30) Foreign Application Priority Data

Mar. 19, 2015 (KR) .................. 10-2015-0038203

(51) Int. Cl.
*G11C 5/14* (2006.01)
*G05F 1/625* (2006.01)

(52) U.S. Cl.
CPC .............. *G11C 5/147* (2013.01); *G05F 1/625* (2013.01)

(58) Field of Classification Search
CPC .................. G11C 5/147; G05F 1/625
See application file for complete search history.

(56) References Cited

U.S. PATENT DOCUMENTS

| 2007/0058474 | A1* | 3/2007 | Sohn | ............... | G11C 5/14 365/226 |
| 2009/0278592 | A1* | 11/2009 | Oh | ............... | G11C 7/12 327/541 |
| 2013/0300389 | A1* | 11/2013 | Lee | ............... | G05F 1/565 323/282 |
| 2015/0091541 | A1* | 4/2015 | Lee | ............... | G05F 1/465 323/273 |

FOREIGN PATENT DOCUMENTS

KR 1020050032826 A 4/2005
KR 100925391 B1 10/2009

* cited by examiner

*Primary Examiner* — Khamdan Alrobaie
(74) *Attorney, Agent, or Firm* — William Park & Associates Ltd.

(57) ABSTRACT

A voltage generation circuit may include: a comparison unit configured to compare a reference voltage and a feedback voltage and output a comparison signal to a node; an output unit configured to generate an internal voltage and the feedback voltage according to a voltage level applied to the node; and a control unit configured to discharge the node when a level of the internal voltage drops to less than a preset level.

21 Claims, 4 Drawing Sheets

VOLTAGE GENERATION CIRCUIT, SEMICONDUCTOR MEMORY APPARATUS HAVING THE SAME, AND OPERATING METHOD THEREOF

CROSS-REFERENCES TO RELATED APPLICATION

The present application claims priority under 35 U.S.C. §119(a) to Korean application number 10-2015-0038203, filed on Mar. 19, 2015, in the Korean Intellectual Property Office, which is incorporated herein by reference in its entirety.

BACKGROUND

1. Technical Field

Various embodiments relate to a semiconductor apparatus, and more particularly, to a voltage generation circuit, a semiconductor memory apparatus having the same, and an operating method thereof.

2. Related Art

A semiconductor memory apparatus may be operated at a voltage having a different level from a voltage level inputted from outside. For example, a low-power electronic device such as a portable electronic device is designed to use a small amount of power, in order to increase a battery duration time as much as possible.

Thus, the semiconductor memory apparatus may include a voltage generation circuit configured to convert an external voltage into a required internal voltage level according to the characteristic of a device to which the semiconductor memory apparatus is applied.

During operation of the semiconductor memory apparatus, current consumption of an internal circuit may momentarily increase or the operating speed of the voltage generation circuit may be delayed. Thus, the internal voltage may become lower than the required level. In this case, the operating speed of the internal circuit may be reduced.

Thus, the voltage generation circuit needs to be designed to supply an internal voltage within a predetermined range at all times, despite a process condition variation, that is, PVT (Process, Voltage, Temperature) variation. Thus, a stable operation of the internal circuit (chip) can be guaranteed through the operation of the voltage generation circuit.

SUMMARY

In an embodiment of the invention, a voltage generation circuit may include a comparison unit configured to compare a reference voltage and a feedback voltage and output a comparison signal to a node. The voltage generation circuit may also include an output unit configured to generate an internal voltage and the feedback voltage according to a voltage level applied to the node. Further, the voltage generation circuit may include a control unit configured to discharge the node when a level of the internal voltage drops to less than a preset level.

In an embodiment of the invention, a semiconductor memory apparatus may include a voltage generation circuit electrically coupled to a node to which a comparison signal is applied and configured to generate an internal voltage and discharge the first node regardless of the comparison signal when a level of the internal voltage drops to less than a preset level. The semiconductor memory apparatus may also include an internal circuit configured to receive the internal voltage.

In an embodiment of the invention, there is provided an operating method of a voltage generation circuit which receives an external voltage and generates an internal voltage. The operating method may include generating the internal voltage based according to an external voltage level. The operating method may also include comparing a feedback voltage generated on the basis of the internal voltage to a reference voltage, and outputting a comparison signal. Further, the operating method may include regenerating the internal voltage regardless of the comparison signal when a level of the internal voltage drops to less than a preset level.

DETAILED DESCRIPTION

Hereinafter, a voltage generation circuit, a semiconductor memory apparatus having the same, and an operating method thereof according to the invention will be described below with reference to the accompanying figures through various embodiments.

Figure 1:
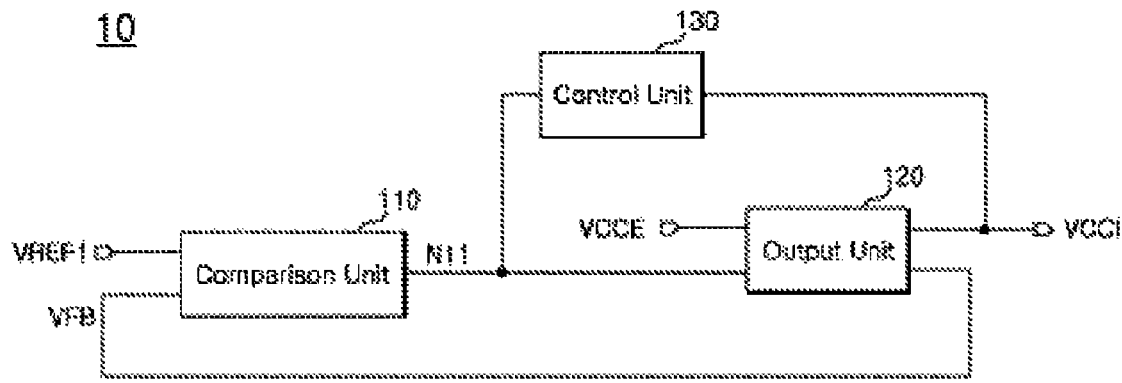
FIG. 1 is a configuration diagram of a voltage generation circuit according to an embodiment of the invention.

Referring to FIG. 1, a configuration diagram of a voltage generation circuit according to an embodiment of the invention is illustrated.

In FIG. 1, the voltage generation circuit 10 according to an embodiment of the invention may include a comparison unit 110, an output unit 120, and a control unit 130.

The comparison unit 110 may compare a first reference voltage VREF1 and a feedback voltage VFB. The voltage level based on the comparison result of the comparison unit 110 may be applied to a first node N11 which is an output node of the comparison unit 110. In an embodiment, the first reference voltage VREF1 may include a bandgap reference voltage.

The output unit 120 may be driven according to the voltage applied to the output node of the comparison unit 110, that is, the first node N11. The output unit 120 can also convert an external voltage VCCE into an internal voltage VCCI. The output unit 120 may generate the feedback voltage VFB based on the internal voltage VCCI. The output unit 120 may also provide the generated feedback voltage VFB to the comparison unit 110. In an embodiment, the feedback voltage VFB may include a divided voltage of the internal voltage VCCI.

The control unit 130 may be electrically coupled to the first node N11 which is the output node of the comparison unit 110. Furthermore, the control unit 130 may be configured to control the voltage level of the first node N11 in response to the internal voltage VCCI. In an embodiment, when the level of the internal voltage VCCI becomes lower than a preset level, the control unit 130 may discharge the first node N11.

When the level of the internal voltage VCCI becomes lower than the preset level, the control unit 130 may discharge the first node N11 of the comparison unit 110 based on the level of the internal voltage VCCI, without relying on the output voltage of the comparison unit 110. Thus, the output unit 120 which is driven according to the voltage level applied to the first node N11 may be operated in response to the voltage level of the first node N11 determined through the control unit 130.

Figure 2:
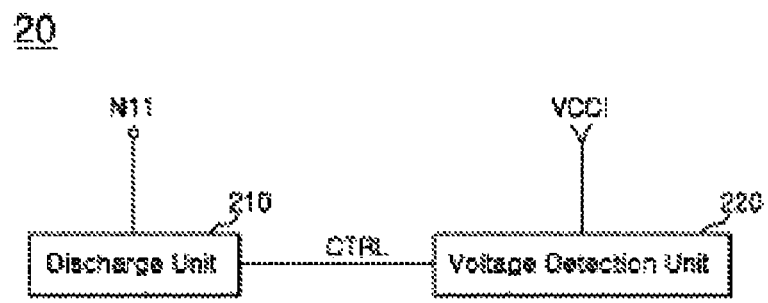
FIG. 2 is a configuration diagram of a control unit according to an embodiment of the invention.

Referring to FIG. 2, an example of the control unit 20 is illustrated, wherein the control unit 20 may include a discharge unit 210 and a voltage detection unit 220.

The voltage detection unit 220 may be configured to generate a control signal CTRL in response to the internal voltage VCCI generated from the output unit 120. The logic level of the control signal CTRL may be determined according to the level of the internal voltage VCCI. In an embodiment, when the level of the internal voltage VCCI is equal to or more than the preset level, the control signal CTRL may be outputted at a first logic level, for example, a logic low level. When the level of the internal voltage VCCI is lower than the preset level, the control signal CTRL may be outputted at a second logic level, for example, a logic high level.

The discharge unit 210 may be electrically coupled to the first node N11 which is the output node of the comparison unit 110. The discharge unit 210 may also be configured to control the voltage level of the first node N11 in response to the control signal CTRL generated through the voltage detection unit 220.

When the level of the internal voltage VCCI is equal to or more than the preset level, the control signal CTRL generated through the voltage detection unit 220 may be generated at the first logic level such that the discharge unit 210 is not operated, thus the voltage level of the first node N11 is maintained. On the other hand, when the level of the internal voltage VCCI drops to a lower level than the preset level, the control signal CTRL generated through the voltage detection unit 220 may have a level capable of driving the discharge unit 210, for example, the second logic level. When the discharge unit 210 is driven in response to the control signal CTRL, the voltage level of the first node N11 may rapidly drop. Then, the output unit 120 may be driven in response to the voltage level of the first node N11 discharged by the control unit 130 regardless of the comparison result of the comparison unit 110. The output unit 120 may also raise the level of the internal voltage VCCI.

Figure 3:
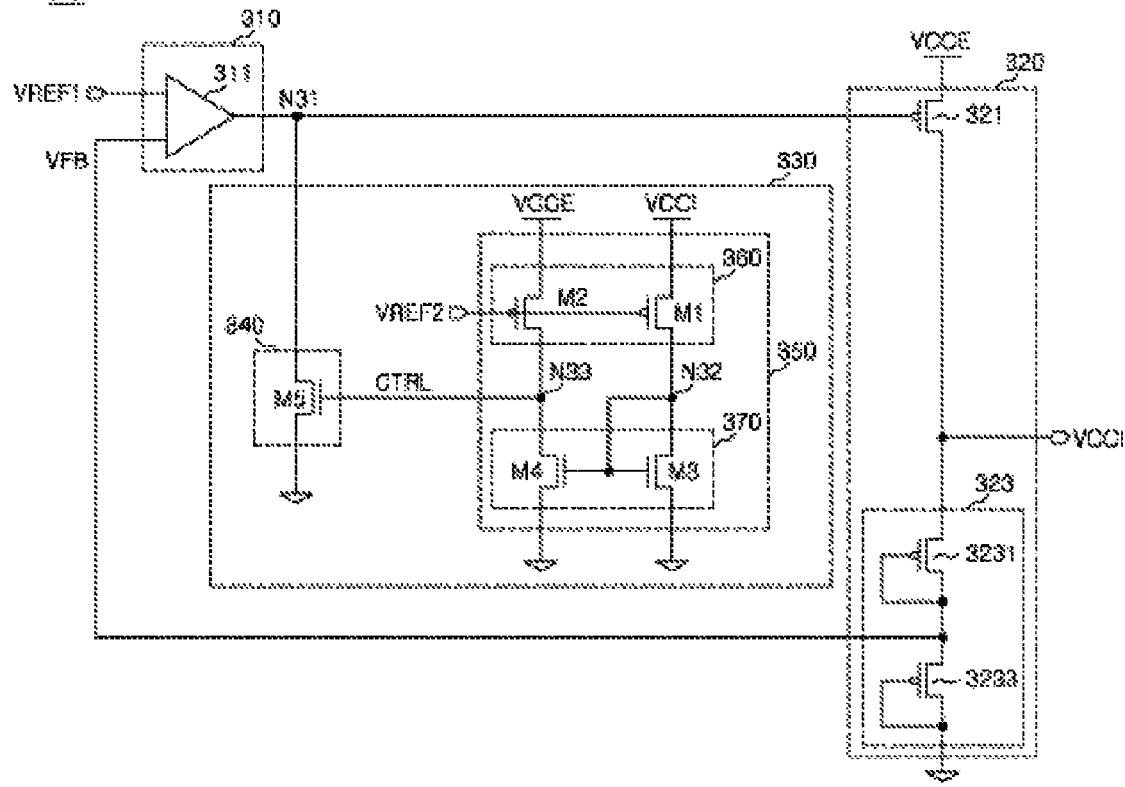
FIG. 3 is a circuit diagram of a voltage generation circuit according to an embodiment of the invention.

Referring to FIG. 3, a circuit diagram of a voltage generation circuit according to an embodiment of the invention is illustrated.

The voltage generation circuit 30 of FIG. 3 may include a comparison unit 310, an output unit 320, and a control unit 330.

The comparison unit 310 may include a comparator 311 which receives a first reference voltage VREF1 through a first input terminal, receives a feedback voltage VFB through a second input terminal, and compares the received voltages.

The output unit 320 may include an internal voltage generation unit 321 and a feedback voltage generation unit 323. The internal voltage generation unit 321 may be driven according to a voltage level applied to a first node N31 which is an output node of the comparison unit 310. The internal voltage generation unit 321 may also convert the level of an external voltage VCCE and output the converted level as an internal voltage VCCI. The feedback voltage generation unit 323 may generate the feedback voltage VFB based on the level of the internal voltage VCCI. In an embodiment, the feedback voltage generation unit 323 may include a plurality of switching elements 3231 and 3233 electrically coupled in series between a ground terminal and an output terminal of the internal voltage VCCI. The feedback voltage generation unit 323 may also generate the feedback voltage VFB from a divided voltage of the internal voltage VCCI.

The control unit 330 may include a discharge unit 340 and a voltage detection unit 350.

The discharge unit 340 may be electrically coupled between the ground terminal and the output node of the comparison unit 310, that is, the first node N31. The discharge unit 340 may also be driven in response to a control signal CTRL generated through the voltage detection unit 350. The discharge unit 340 may be configured to control a voltage level of the first node N31 according to the control signal CTRL.

The voltage detection unit 350 may be configured to generate the control signal CTRL based on the amount of current which is determined according to the level of the internal voltage VCCI. The voltage detection unit 350 may include a current source 360 and a current mirror 370, for example.

The current source 360 may control the amount of current supplied to the current mirror 370 according to the level of the internal voltage VCCI. In an embodiment, the current source 360 may include a first transistor M1 and a second transistor M2. The first transistor M1 may be driven in response to a second reference voltage VREF2. The first transistor M1 may also provide a current corresponding to the level of the internal voltage VCCI to a second node N32. Further, the second transistor M2 may be electrically coupled between a supply terminal of the external voltage VCCE and a third node N33 which is an output terminal of the control signal CTRL, and driven in response to the second reference voltage VREF2.

In an embodiment, the second reference voltage VREF2 may be provided at a level capable of turning on the first and second transistors M1 and M2, when the internal voltage VCCI is generated at a preset level or more. The second reference voltage VREF2 may include a bandgap reference voltage.

The current mirror 370 may generate the control signal CTRL of which the voltage level is determined on the basis of the current supplied through the current source 360. In an embodiment, the current mirror 370 may include third and fourth transistors M3 and M4 driven according to the voltage level of the second node N32. The third transistor M3 may be diode-coupled to the second node N32. Further, the fourth transistor M4 may be electrically coupled between the third node N33 and the ground terminal.

When the internal voltage VCCI is equal to or more than the preset level or more, a sufficient voltage level difference may be set between the source voltage VCCI and the gate voltage VREF2 of the first transistor M1. Then, a sufficient amount of current corresponding to the voltage level difference may flow into the second node N32 through the first transistor M1. Thus, as the gate biases of the third and fourth transistors M3 and M4 increase, the third and fourth transistors M3 and M4 may be turned on. In addition, the voltage level of the third node N33 may drop to substantially a logic low level. Therefore, since the control signal CTRL becomes the logic low level, a fifth transistor M5 constituting the discharge unit 340 may be turned off. In other words, when the internal voltage VCCI is equal to or more than the preset level, the control unit 330 may not be operated. The control unit 330 may have no influence on the voltage level of the first node N31.

When the internal voltage VCCI drops to a lower level than the preset level, a difference between the gate voltage VREF2 of the first transistor M1 and the source voltage VCCI may decrease. Thus, the amount of current induced in the second node N32 may also decrease. Then, the gate biases of the third and fourth transistors M3 and M4 may be reduced. Further, the bias of the third node N33 may be increased to turn on the fifth transistor M5 constituting the discharge unit 340. As the fifth transistor M5 is turned on, the first node N31 may be rapidly discharged. Then, the first switching element 321 constituting the output unit 320 may be turned on. Thus, the internal voltage VCCI may be raised to the preset level or more and then outputted.

As such, when the level of the internal voltage VCCI drops, the response speed of the voltage generation circuit 10 or 30 may be improved by the control unit 130 or 330. Accordingly, the internal voltage VCCI may be stably generated at high speed.

Figure 4:
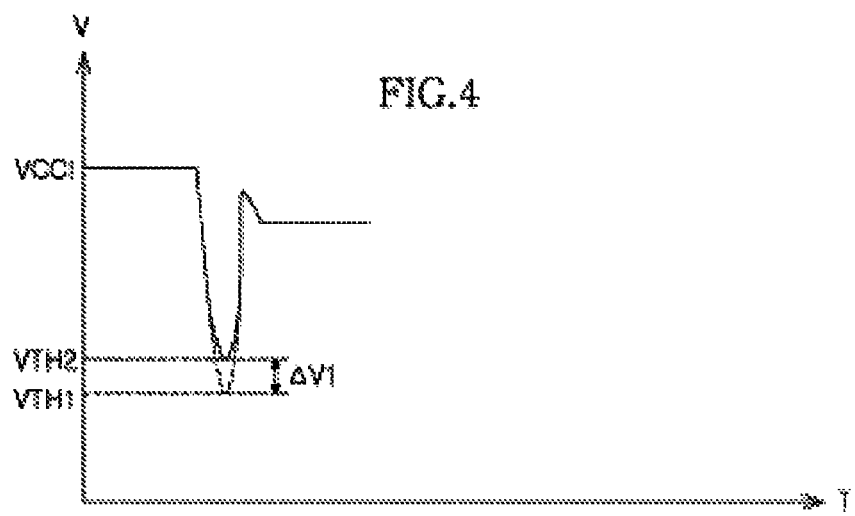
FIGS. 4 and 5 are graphs for describing the operation of the voltage generation circuit according to an embodiment of the invention.
Figure 5:
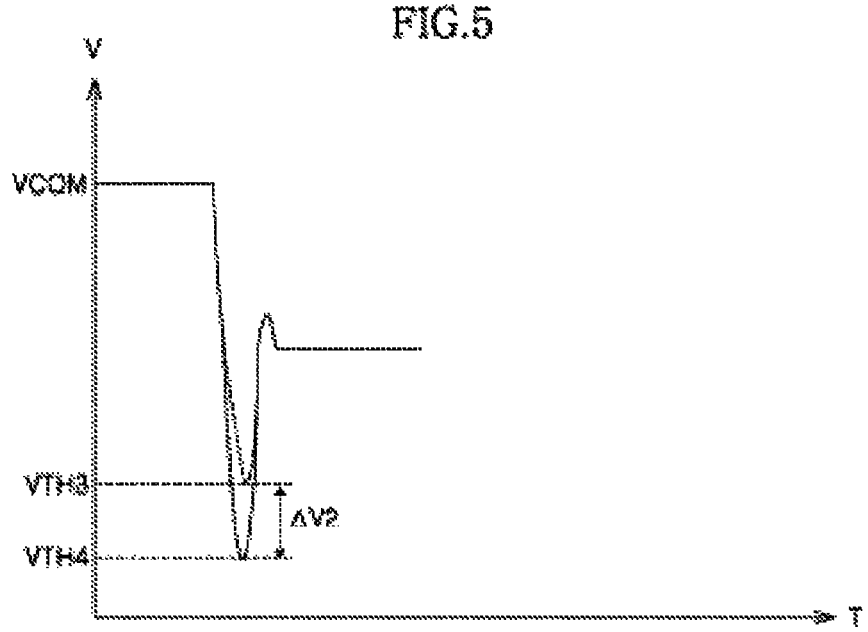

Referring to FIGS. 4 and 5, graphs for describing the operation of the voltage generation circuit according to an embodiment of the invention are described.

FIG. 4 illustrates an output profile of the internal voltage VCCI depending on the existence of the control unit 130, 20, or 330.

In the case of a voltage generation circuit which does not include the control unit 130, 20, or 330 (refer to a dotted line), an output signal of the comparison unit can drive the output unit after the level of the internal voltage VCCI drops to a first threshold voltage VTH1. Further, the level of the internal voltage VCCI may rise from the first threshold voltage VTH1 and return to a target level.

On the other hand, the voltage generation circuit 10 or 30 including the control unit 130, 20, or 330 may rapidly discharge the output node N11 or N31 of the comparison unit 110 or 310 through the control unit 130, 20, or 330, when the level of the internal voltage VCCI drops to less than the preset level. Thus, the internal voltage VCCI may rise again in a state where the level of the internal voltage VCCI dropped to a second threshold voltage VTH2 higher than the first threshold voltage VTH1, and rapidly return to the target level.

The voltage generation circuit may prevent a drop of the internal voltage VCCI by a voltage level difference ΔV1 between the first and second threshold voltages VTH1 and VTH2, which indicates that the internal voltage VCCI can rapidly reach the target level.

FIG. 5 illustrates an output profile of a comparison signal VCOM applied to the output node N11 or N31 of the comparison unit 110 or 310 depending on the existence of the control unit 130, 20, or 330.

In the voltage generation circuit which does not include the control unit 130, 20, or 330, the comparison voltage VCOM applied to the output node of the comparison unit may rely on only the comparison result between the first reference voltage VREF1 and the feedback voltage VFB. Accordingly, when the level of the internal voltage VCCI drops to less than the preset level, the level of the comparison signal VCOM may gradually drop to the level of a third threshold voltage VTH3.

On the other hand, in the voltage generation circuit 10 or 30 including the control unit 130, 20, or 330, the level of the comparison signal VCOM may rely on the operation of the control unit 130, 20, or 300 as well as the output of the comparison unit 110 or 310. When the level of the internal voltage VCCI drops to less than the preset level, the output nodes N11 and N31 may be rapidly discharged by the control unit 130, 20, or 330. Thus, the level of the comparison signal VCOM may rapidly drop to a fourth threshold voltage VTH4 lower than the third threshold voltage VTH3. As a result, the output unit 120 or 320 may be driven at high speed.

Thus, the response speed of the output unit 120 or 320 may be improved by a voltage level difference ΔV2 between the third and fourth threshold voltages VTH3 and VTH4.

Figure 6:
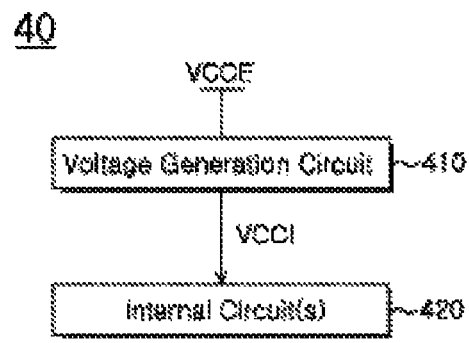
FIG. 6 is a configuration diagram of a semiconductor memory apparatus according to an embodiment of the invention.

Referring to FIG. 6, a configuration diagram of a semiconductor memory apparatus according to an embodiment of the invention is described.

The semiconductor memory apparatus 40 according to an embodiment of the invention may include a voltage generation circuit 410 and one or more internal circuits 420. The voltage generation circuit 410 may receive an external voltage VCCE and output an internal voltage VCCI at a preset level. Further, the one or more internal circuits 420 may be operated according to the internal voltage VCCI provided from the voltage generation circuit 410. The one or more internal circuits 420 may be configured to receive the internal voltage VCCI.

The internal circuit 420 may include a memory chip, for example, a nonvolatile memory chip implemented with a flash memory element. However, the internal circuit 420 is not limited thereto.

The voltage generation circuit 410 may detect a drop in level of the internal voltage VCCI. The voltage generation circuit 410 may also rapidly raise the level of the internal voltage VCCI in response to the drop in level of the internal voltage VCCI. In an embodiment, the voltage generation circuit 410 may be implemented with the circuit described with reference to FIGS. 1 to 3, but is not limited thereto.

Figure 7:
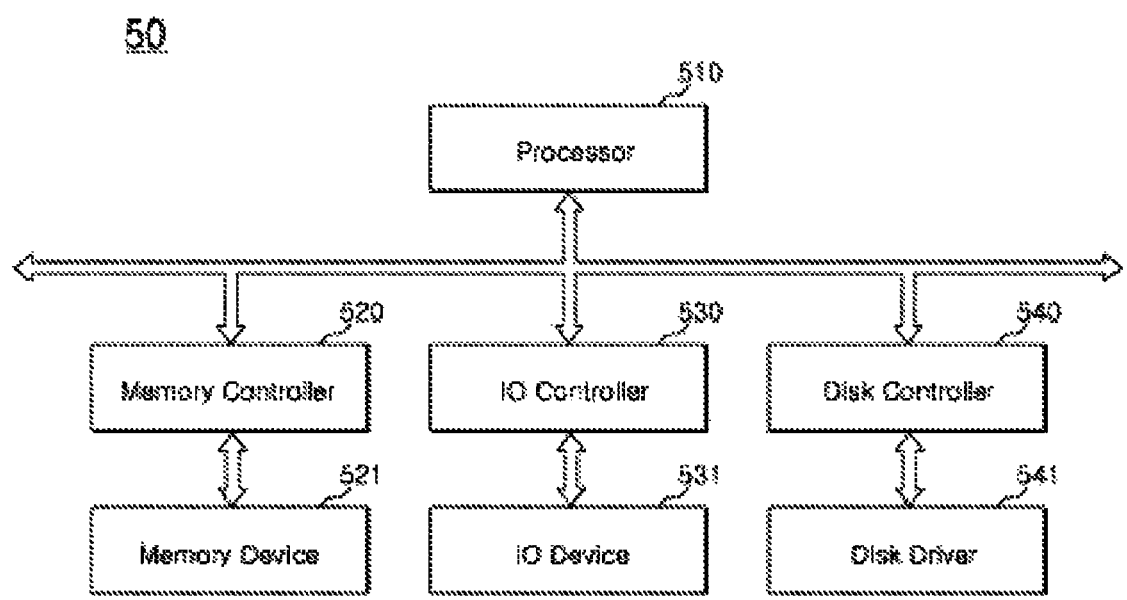
FIG. 7 is a configuration diagram of an electronic system according to an embodiment of the invention.

Referring to FIG. 7, a configuration diagram of an electronic system according to an embodiment of the invention is described.

The electronic system 50 according to an embodiment of the invention may include a processor 510, a memory controller 520, a memory device 521, an IO controller 530, an IO device 531, a disk controller 540, and a disk driver 541.

The electronic system 50 may include one or more processors 510 which can be operated independently or in connection with another processor. The processor 510 can communicate with other elements, for example, the memory controller 520, the IO controller 530, and the disk controller 540, through buses (a control bus, an address bus, and a data bus).

The memory controller 520 may be electrically coupled to one or more memory devices 521. The memory controller 520 may receive a request provided from the processor 510, and control one or more memory devices 521 based on the request.

The memory device 521 may include the semiconductor memory apparatus illustrated in FIG. 6.

The IO controller 530 may be electrically coupled between the processor 510 and the IO device 531. The IO controller 530 may also transmit an input from the IO device 531 to the processor 510 or provide a processing result of the processor 510 to the IO device 531. The IO device 531 may include an input device such as keyboard, mouse, touch screen, or mike and an output device such as display or speaker.

The disk controller 540 may control one or more disk drivers 541 according to control of the processor 510.

In such an electronic system 50, when the memory device 521 is operated under control of the processor 510, the voltage generation circuit provided in the memory device 521 may receive an external voltage VCCE, convert the received voltage into an internal voltage VCCI, and provide the internal voltage VCCI to the internal circuit. In particular, when the level of the internal voltage VCCI drops, the voltage generation circuit may detect the drop in level of the internal voltage VCCI. Further, the voltage generation circuit may rapidly raise the level of the internal voltage VCCI in response to the detection of the drop. The voltage generation circuit may be implemented with the circuits described through FIGS. 1 to 3, but is not limited thereto.

The semiconductor memory apparatus including the voltage generation circuit illustrated in FIGS. 1 to 3 may be operated as follows. First, the semiconductor memory apparatus may generate an internal voltage based on an external voltage level. Furthermore, the semiconductor memory apparatus may compare a feedback voltage generated on the basis of the internal voltage to a first reference voltage. When the level of the internal voltage is equal to or more than a preset level, the semiconductor memory apparatus may regenerate the internal voltage based on the comparison result between the feedback voltage and the first reference voltage. Furthermore, when the level of the internal voltage drops to less than the preset level, the semiconductor memory apparatus may regenerate the internal voltage regardless of the comparison result between the feedback voltage and the first reference voltage. Thus, without a time delay required for comparing the first reference voltage and the feedback voltage, the semiconductor memory apparatus may regenerate the internal voltage at a desired level.

While certain embodiments have been described above, it will be understood to those skilled in the art that the embodiments described are by way of examples only. Accordingly, the voltage generation circuit described should not be limited based on the described embodiments. Rather, the voltage generation circuit described herein should only be limited in light of the claims that follow when taken in conjunction with the above description and accompanying figures.

What is claimed is:

1. The voltage generation circuit comprising:
   a comparison unit configured to compare a reference voltage and a feedback voltage and output a comparison signal to a node;
   an output unit configured to generate an internal voltage and the feedback voltage according to a voltage level applied to the node; and
   a control unit configured to discharge the node when a level of the internal voltage drops to less than a preset level.

2. The voltage generation circuit according to claim 1, wherein the output unit comprises:
   an internal voltage generation unit configured to receive an external voltage and generate the internal voltage in response to the voltage level applied to the node; and
   a feedback voltage generation unit configured to generate the feedback voltage by dividing the internal voltage.

3. The voltage generation circuit according to claim 1, wherein the control unit comprises:
   a voltage detection unit configured to generate a control signal according to the level of the internal voltage; and
   a discharge unit configured to control the voltage level of the node in response to the control signal.

4. The voltage generation circuit according to claim 3, wherein the voltage detection unit is configured to generate the control signal at a first logic level when the level of the internal voltage is equal to or more than the preset level, and generate the control signal at a second logic level when the level of the internal voltage is lower than the preset level.

5. The voltage generation circuit according to claim 1, wherein the control unit comprises a discharge unit configured to generate a control signal in response to the amount of current determined according to the level of the internal voltage, and
   a voltage detection unit comprising:
   a current source configured to supply a current corresponding to the level of the internal voltage; and
   a current mirror configured to determine a level of the control signal based on the amount of current supplied from the current source.

6. The voltage generation circuit according to claim 1, wherein the control unit comprises a discharge unit electrically coupled between the node and a ground terminal, and configured to control the voltage level of the node in response to a control signal generated according to the level of the internal voltage.

7. A semiconductor memory apparatus comprising:
   a voltage generation circuit electrically coupled to a node to which a comparison signal is applied and configured to generate an internal voltage and discharge the node regardless of the comparison signal when a level of the internal voltage drops to less than a preset level; and
   an internal circuit configured to receive the internal voltage.

8. The semiconductor memory apparatus according to claim 7, wherein the voltage generation circuit comprises:
   a comparison unit configured to compare a reference voltage and a feedback voltage and output the comparison signal to the node;
   an output unit configured to generate the internal voltage and the feedback voltage in response to a voltage level applied to the node; and
   a control unit configured to control the voltage level of the node according to the internal voltage.

9. The semiconductor memory apparatus according to claim 8, wherein the output unit comprises:
   an internal voltage generation unit configured to receive an external voltage and generate the internal voltage in response to the voltage level applied to the node; and
   a feedback voltage generation unit configured to generate the feedback voltage by dividing the internal voltage.

10. The semiconductor memory apparatus according to claim 8, wherein the control unit comprises:
    a voltage detection unit configured to generate a control signal based on the level of the internal voltage; and
    a discharge unit configured to control the voltage level of the node in response to the control signal.

11. The semiconductor memory apparatus according to claim 8, wherein the control unit comprises a discharge unit configured to generate a control signal in response to an amount of current determined according to the level of the internal voltage, and
    a voltage detection unit comprising:
    a current source configured to supply the current corresponding to the level of the internal voltage; and
    a current mirror configured to determine a level of the control signal based on the amount of current supplied from the current source.

12. The semiconductor memory apparatus according to claim 8, wherein the control unit comprises a discharge unit electrically coupled between the node and a ground terminal, and configured to control the voltage level of the node in response to a control signal generated according to the level of the internal voltage.

13. An operating method of a voltage generation circuit which receives an external voltage and generates an internal voltage, the operating method comprising:
   generating the internal voltage according to an external voltage level;
   comparing a feedback voltage generated on the basis of the internal voltage to a reference voltage, and outputting a comparison signal; and
   regenerating the internal voltage regardless of the comparison signal when a level of the internal voltage drops to less than a preset level.

14. The operating method according to claim 13, wherein the step of regenerating the internal voltage comprises discharging a node to which the comparison signal is applied.

15. The operating method according to claim 13, further comprising:
   regenerating the internal signal in response to the comparison signal when the level of the internal voltage is equal to or more than the preset level.

16. The operating method according to claim 13, wherein a node is discharged without relying on an output voltage of a comparison unit.

17. The operating method according to claim 13, further comprising:
   generating a control signal according to the internal voltage; and
   outputting the control signal at a first logic level or a second logic level according to whether the level of the internal voltage is equal, more than, or less than the preset level.

18. The operating method according to claim 17, further comprising:
   maintaining the voltage level of a node to which the comparison signal is applied when the level of the internal voltage is equal to or more than the preset level.

19. The operating method according to claim 17, further comprising:
   discharging a node to which the comparison signal is applied when the level of the internal voltage is lower than the preset level.

20. The operating method according to claim 13, further comprising:
   driving an output unit according to a voltage level of a node, wherein the output unit is configured to raise the level of the internal voltage.

21. The operating method according to claim 13, further comprising:
   decreasing the level of the internal voltage to second threshold voltage that is greater than a first threshold voltage.

* * * * *